United States Patent

Asano et al.

[11] Patent Number: 5,145,715
[45] Date of Patent: Sep. 8, 1992

[54] LIGHT TRANSMISSION PASTE AND METALLIC COPPER DEPOSITION METHOD USING SAME

[75] Inventors: Takahiro Asano, Moriguchi; Shinichi Mizuguchi, Katano, both of Japan

[73] Assignee: Matsushita Electric Industrial Co., Ltd., Osaka, Japan

[21] Appl. No.: 569,288

[22] Filed: Aug. 17, 1990

[30] Foreign Application Priority Data

Aug. 22, 1989 [JP] Japan .................... 1-216449

[51] Int. Cl.$^5$ .................... B05D 3/06; B05D 5/12; B05D 1/18; B05D 3/04
[52] U.S. Cl. .................... 427/54.1; 427/96; 427/123; 427/304; 427/443.1
[58] Field of Search .................... 427/54.1, 53.1, 96, 427/123, 125, 304, 305, 306, 443.1

[56] References Cited

U.S. PATENT DOCUMENTS

| | | | |
|---|---|---|---|
| 3,056,881 | 10/1962 | Schwarz | 219/50 |
| 3,347,724 | 10/1967 | Schnebler, Jr. et al. | 427/265 |
| 3,451,813 | 6/1969 | Kinney et al. | 96/36.2 |
| 3,671,249 | 6/1972 | Flynn | 96/88 |
| 3,928,670 | 12/1975 | Brummett et al. | 427/53 |
| 3,993,799 | 11/1976 | Feldstein | 427/305 |
| 4,388,351 | 6/1983 | Sawyer | 427/305 |
| 4,590,115 | 5/1986 | Cassat | 427/306 |
| 4,761,303 | 8/1988 | Ruszczyk et al. | 427/305 |
| 4,831,210 | 5/1989 | Larson et al. | 427/306 |

FOREIGN PATENT DOCUMENTS 0402966 12/1990 European Pat. Off. .

*Primary Examiner*—Marianne Padgett
*Attorney, Agent, or Firm*—Wenderoth, Lind & Ponack

[57] ABSTRACT

Light transmission paste and a metallic copper deposition method of the present invention can educe metallic copper in the desired portion by applying or contacting light transmission paste on cuprous oxide and applying light upon the desired portion. Also, the light is applied through a mask corresponding to the pattern to be obtained, so that desired circuit pattern may be easily obtained. Further, metallic copper of high density may be educed by the contacting or applying metal deposition paste upon metal of a substrate.

4 Claims, 4 Drawing Sheets

LIGHT TRANSMISSION PASTE AND METALLIC COPPER DEPOSITION METHOD USING SAME

BACKGROUND OF THE INVENTION

The present invention generally relates to light transmission paste and a metallic copper deposition method using it.

A circuti pattern formation in the conventional hybrid IC was effected by a printing method on an alumina ceramic substrate. The fundamental component in the printing method is composed of a screen 1 which has an empty hole corresponding to the circuit pattern to be drawn on the substrate and a squeegee 2 as described in FIG. 5. Also, the screen 1 is retained parallel to the substrate 3 and in a position approximately 0.25 mm through 2.0 mm from the surface of the substrate 3. Conductive paste 4 which becomes patterns 5 is placed on the screen 1. The conductive paste 4 is depressed by the squeegee 2 moving along and depressing the screen 1. As a result, the conductive paste 4 is moved onto the substrate 3 from the empty hole portion in the screen 1, and the patterns 5 are formed on the substrate 3.

It is proposed recently that the patterns should be formed on the substrate by a drawing method. The conductive paste 4 is filled into a paste cartridge 7 as shown in FIG. 6. The paste cartridge 7 is formed in a cylindrical shape, is contracted in its lower end portion, and is provided with an empty hole 0.06 through 2 mm in diameter. The paste which is in the cartridge having a certain diameter hole at its lower end portion is subject to pressure application through the air or the like upon the upper end portion of the paste cartridge 7. By the movement of the paste cartridge 7 while the paste is being discharged, the pattern 5 of a given line width is drawn.

In the printing method, the screen 1 must be replaced also after this when the pattern to be obtained has been changed. The screen 1 is also expanded through a certain number of printing operations if the pattern is the same. Thus, a positional shift is caused in the printed pattern 5. Therefore, the screen must to be exchanged on the A uniform screen 1 is not always available, when the screen must to be exchanged, because of the working accuracy of the screen frame, the accuracy necessary when the screen 1 is pasted on the frame, and so on. Therefore, in the exchange of the screen 1, adjustments such as new positional alignment, parallel arrangement of the substrate 3 and the screen 1 are necessary. But it takes about thirty minutes at least for the adjustment, thus reducing the operation rate of the hybrid IC production line.

When the pattern 5 is designed, and tested, about four days are required to make the screen, so that the development period is caused to be extended.

In the drawing method, a program with pattern coordinates having been inputted has only to be changed even when there are changes in the pattern 5, so that these changes hardly cause stoppage of the hybrid IC production line. But the empty hole in the tip end portion of the paste cartridge 7 at this time is restricted to 0.06 through 2 mm in diameter, and also the pattern is basically formed with lines, with a disadvantage that the productivity is extremely lower as compared with the printing method.

Recently a method has been conducted of making a pattern forming circuit which does not reduced the operation rate of the hybrid IC production line, even in a case where a substrate of a different pattern is obtained, and further this method is available even in mass production. In one example, the disproportioned reaction of cuprous oxide is used.

The reaction expressed by $$2Cu^+ \rightleftharpoons Cu^o + Cu^{2+} \tag{1}$$

is caused in a portion where light of 280 nm through 640 nm has been applied under a weak acidic condition such as 0.002N sulfuric acid aqueous solution so as to produce metallic copper, so that the metallic copper may be selectively educed and the pattern is formed.

In order to cause the disproportioned reaction of the cuprous oxide, the light of 280 nm through 640 nm is required to be applied under the weak acidic condition. As shown in FIG. 7 (A), the cuprous oxide 8 was applied on the substrate 3 forming the pattern. Then, as shown in FIG. 7 (B), it was dipped into a weak acidic aqueous solution such as dilute sulfuric acid or the like, and light from a light source 11 is applied upon it a pattern formed by the mask 10, thus obtaining the pattern 12.

But only half of the cuprous oxide applied as shown in the equation (1) became the metallic copper in the disproportioned reaction of the cuprous oxide. It was difficult to raise this ratio. The reduction in the final density of the metallic copper caused the electronic circuit have an extremely high resistance value. Therefore, it is necessary to raise the density of the metallic copper by another method. One of the methods to be generally taken at this time is a physical development. As shown in FIG. 8 (A), the cuprous oxide which was not reacted with an aqueous solution of sodium thiosulfate or the like was removed. The pattern 12 existing on the substrate 3 was retained in a metallic salt aqueous solution 13 in a reducing atmosphere as shown in FIG. 8 (B) so that as to grow around the metallic the component metal of the metallic salt grows around the metallic copper as a nucleus, thus producing a copper pattern 14 of high density.

In the disproportioned reaction of the cuprous oxide under the weak acidic aqueous solution by this method, the thickness of the weak acidic aqueous solution on it is required to be constant across the whole face with the cuprous oxide existing on it if a precise pattern is to be formed, because the refractive index of the light in the air and within the weak acidic aqueous solution is different. Therefore, the light cannot be applied upon the cuprous oxide until the cuprous oxide put into the weak acidic aqueous solution becomes certain with respect to the weak acidic aqueous solution surface. Thus, it was considerably difficult to use this method for the making of the pattern. Since the acidic aqueous solution caused the corrosion of metal, it was difficult to use it in the production line.

In the physical development using the metallic salt aqueous solution within the production line, problems such as metallic salt aqueous solution exchange, waste processing and so on are undesirably caused.

SUMMARY OF THE INVENTION

Accordingly, an essential object of the present invention is to provide light transmission paste for deposition of metallic copper by the disproportioned reaction of cuprous oxide except for liquid phase, and a metallic copper deposition method using it.

In accomplishing the object, according to one preferred embodiment of the present invention, there is provided light transmission paste which includes acidic material and is transparent with the wavelength of 280 nm through 640 nm.

The present invention is a light transmission paste which includes hydrochloric acid, nitric acid, sulfuric acid or p-toluene sulfonic acid.

The present invention is also a metallic copper deposition method, which comprises the steps of applying upon cuprous oxide provided on a substrate light transmission paste that includes acidic material, and is transparent with the wavelength of 280 nm through 640 nm, thereafter applying light of 280 nm through 640 nm upon the desired portion, then removing the light transmission paste, depositing metallic copper from the cuprous oxide of the irradiation portion.

The present invention is a circuit pattern forming method, which comprises the steps of applying upon cuprous oxide provided on a substrate light transmission paste that includes acidic material, and is transparent with the wavelength of 280 nm through 640 nm, thereafter applying light of 280 nm through 640 nm through a mask having an opening portion corresponding to a pattern to be formed to educe metallic copper on the irradiation portion, then removing the light transmission paste and the mask, forming the desired circuit pattern on the substrate.

Also, the present invention is a light transmission sheet so composed that the light transmission paste which includes the acidic material, and is transparent with the wavelength of 280 nm through 640 nm is applied upon a support member which is transparent with the wavelength of 280 nm through 640 nm.

Also, the present invention is a metallic copper deposition method, which comprises the steps of causing the light transmission sheet of the present invention to contact the cuprous oxide formed on the substrate, applying the wavelength of 280 nm through 640 nm upon the desired portion of the cuprous oxide from the transparent support member side, thereafter removing the above described light transmission sheet, depositing the metallic copper from the cuprous oxide of the irradiation portion.

Also, the present invention is a circuit pattern forming method, which comprises the steps of causing the light transmission sheet of the present invention to contact the cuprous oxide formed on the substrate, applying the wavelength of 280 nm through 640 nm upon the cuprous oxide from the transparent support member side through a mask having an opening portion corresponding to a pattern to be formed to educe the metallic copper on the irradiation portion, then removing the above described light transmission paste and the above described mask, forming the desired circuit pattern on the substrate.

Also, the present invention is a metal deposition method, which comprises the steps of causing a metal deposition paste that includes a metallic salt with a metal to be educed provided therein and a reducing agent for reducing, the metallic salt to contact the metal provided on the substrate, depositing the metal of the metallic salt in the above described metallic deposition paste on the metallic surface on the above described substrate.

Further, the present invention is a metallic copper deposition method, by the use of the metallic copper deposition method of the present invention, which comprises the steps of depositing the metallic copper, thereafter causing the metal deposition paste that includes the metallic salt including copper and the reducing agent for reducing, the metallic salt, to contact the copper provided on the substrate.

The light transmission paste of the present invention captures $Cu^{2+}$ of the cuprous oxide upon which the light of the wavelength of 280 nm through 640 nm has been applied.

The light transmission paste of the present invention is applied on the cuprous oxide and is caused to come into contact with it, and educes metallic copper on the irradiated portion by the application of the light upon the desired portion.

Also, the metallic deposition paste is brought into contact with the metal on the substrate, so that metallic copper of high density may be provided.

BRIEF DESCRIPTION OF THE DRAWINGS

These and other objects and features of the present invention will become apparent from the following description taken in conjunction with the preferred embodiment thereof with reference to the accompanying drawings, in which.

EMBODIMENTS

Figure 1A:
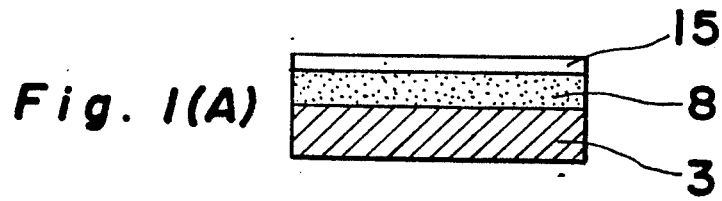
FIG. 1A and 1B are a step sectional view showing a circuit pattern forming method in a first embodiment of the present invention.

Before the description of the present invention proceeds, it is to be noted that like parts are designated by like reference numerals throughout the accompanying drawings.

EMBODIMENT 1

Figure 1B:
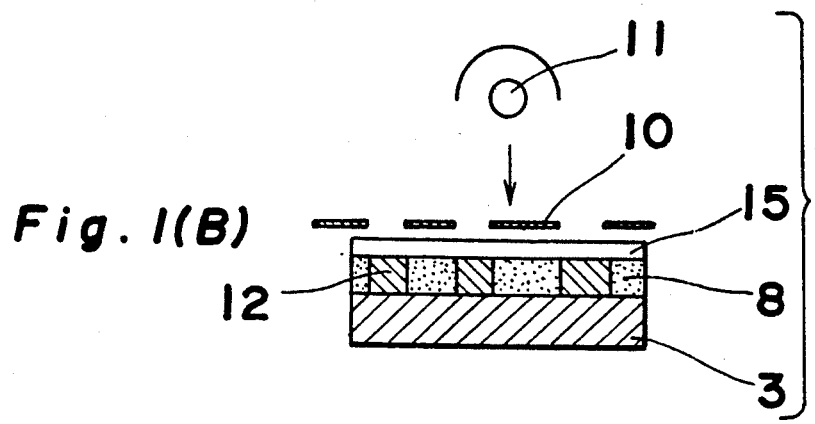

FIG. 1 (A), (B) are sectional views showing a circuit pattern forming method in a first embodiment of the present invention. First, gelatin powder, 50 g, is added into water, 500 ml. It is heated at 50° C. 36N-sulfuric acid 0.01 ml is mixed with the gelatin powder completely melted into a light transmission paste. It is applied on cuprous oxide 8 applied on substrate 3 in a dark room. It is cooled, hardened at 5° C. into light transmission membrane 15. This is exposed light only in the portion for depositing the metallic copper through a stainless-make mask 10 having an openings corresponding to the desired pattern which are adapted to transmit light of light source 11 using a tungsten light as shown in FIG. 1 (B). As a result, the light applied through the mask 10 reaches the cuprous oxide through the light transmission membrane 15. At this time, since the cuprous oxide is put under the acidic atmosphere by the light transmission membrane 15, the disproportioned reaction is caused to educe the metallic copper pattern 12. Finally, the light transmission paste 15 was removed. Since the light was not applied upon the aqueous of solution sodium thiosulfate (sodium thiosulfate, 25 g, with respect to water, 100 ml), the disproportioned reaction was not caused. The residual cuprous oxide was removed.

Although the stainless-mask 10 was used for patterning the light in the present embodiment, the light may be stopped into a beam state and be scanned.

Although the gelatin was mixed into the light transmission membrane 15, other high molecular agents such as polyvinyl alcohol, cellulose acetate or the like may be used. Further, an acidic reagent such as hydrochloric acid, acetic acid, p-toluene sulfonic acid or the like may be used, instead of the sulfuric acid.

EMBODIMENT 2

Figure 2A:
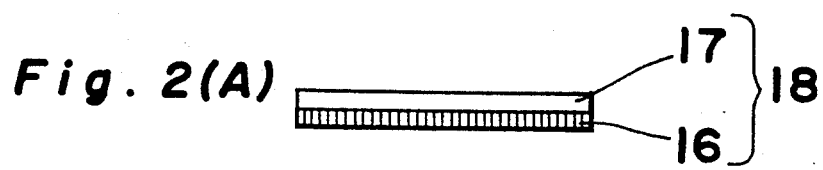
FIG. 2A, 2B and 2C are a step sectional view showing a circuit pattern forming method in a second embodiment of the present invention.
Figure 2B:
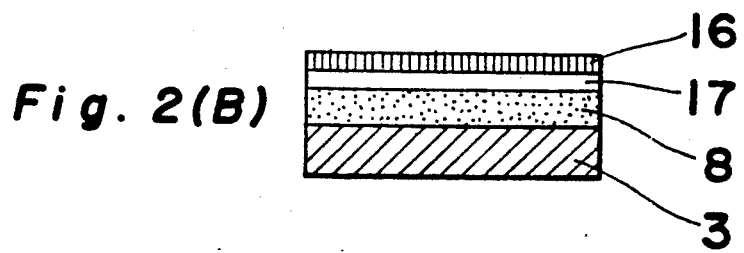
Figure 2C:
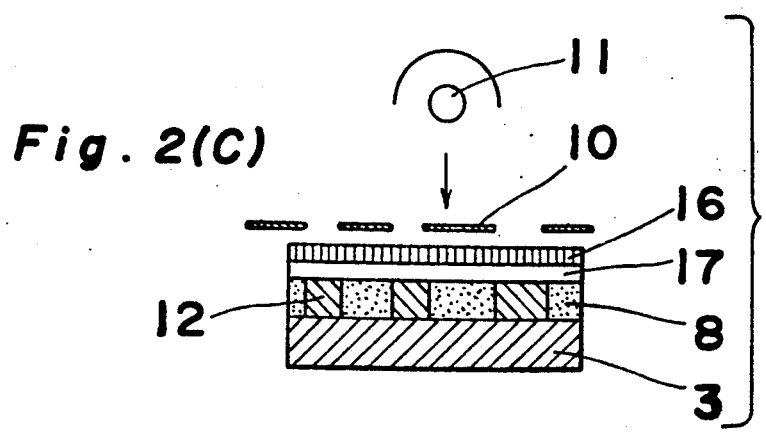

FIG. 2 (A), (B), (C) are sectional views showing a circuit pattern forming method in a second embodiment of the present invention. First, gelatin powder, 30 g, is added into water, 500 ml. It is heated at 50° C. 36N-sulfuric acid 0.01 ml is mixed with the gelatin powder which is completely melted. It is applied as a layer 17 on a transparent support member made of cellulose triacetate as shown in FIG. 2 (A), to make a light transmission sheet 18 shown in FIG. 2 (B), it is caused into contact with the cuprous oxide 8 with the layer 17 of the light transmission sheet 18 is contacted with oxide 8 applied on substrate 3. This is irradiated only upon the portion for patterning, and deposition of the metallic copper, through a stainless-mask 10 corresponding to the pattern which is adapted to transmit the light of light source 11 using a tungsten lamp as shown in FIG. 2 (C). Thus, the light patterned by the mask 10 reaches the cuprous oxide 8 through the transparent support member of the light transmission sheet and the layer 17. At this time, as the cuprous oxide 8 is put under the acidic atmosphere by the layer 17, the disproportioned reaction is caused, and the metallic copper pattern 12 is educed. Finally the light transmission sheet 18 is removed.

Although the stainless-mask 16 was used for patterning the light in the present embodiment, the light may be stopped into a beam state and be scanned.

Although the gelatine was mixed into the layer 17, other high molecular agents such as polyvinyl alcohol, cellulose acetate or the like may be used. Also, although the cellulose triacetate was used as the transparent support member, polyester or the like which is transparent may be used in at least one portion of the 280 nm through 640 nm. Further, acidic reagents such as hydrocloric acid, acetic acid, p-toluene sulfonic acid or the like may be used, instead of the sulfuric acid.

EMBODIMENT 3

Figure 3A:
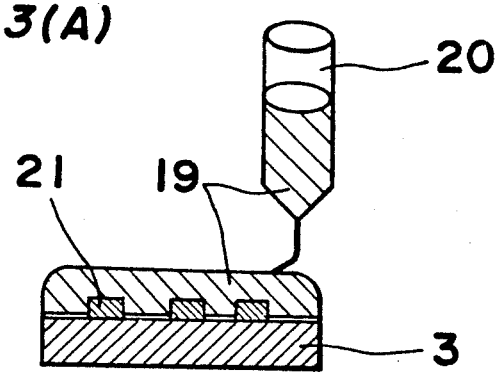
FIG. 3A and 3B are a step sectional view showing a metallic copper deposition method in a third embodiment of the present invention.
Figure 3B:
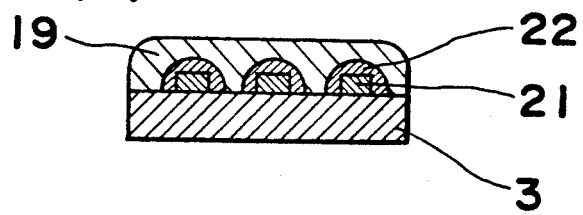
Figure 4D:
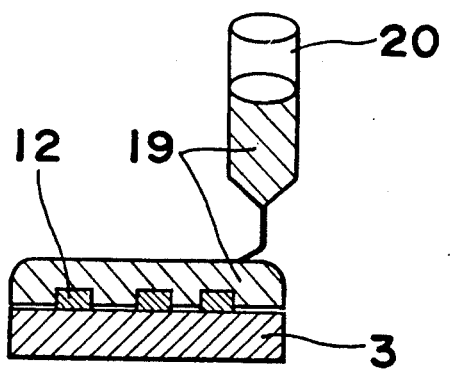
FIG. 4A, 4B, 4C, 4D, 4E and 4F are a step sectional view showing a circuit pattern forming method in a fourth embodiment of the present invention.
Figure 4A:
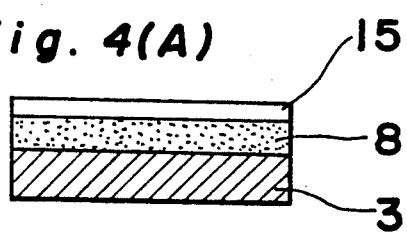
Figure 4B:
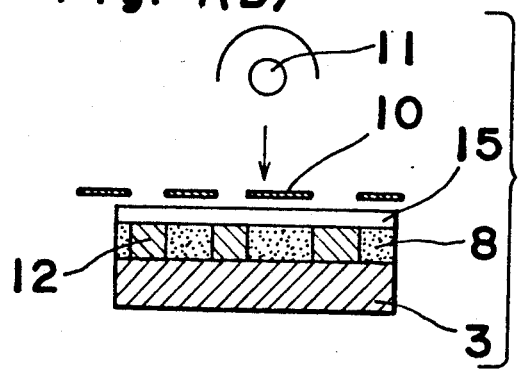
Figure 4E:
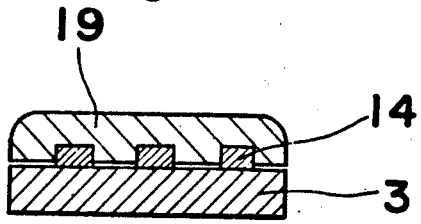
Figure 4C:
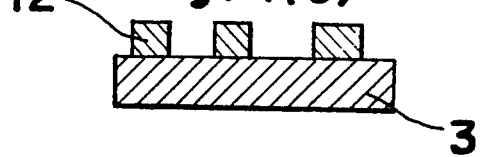
Figure 4F:
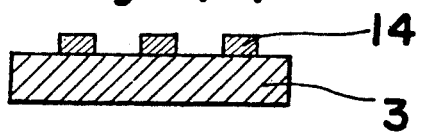
Figure 5:
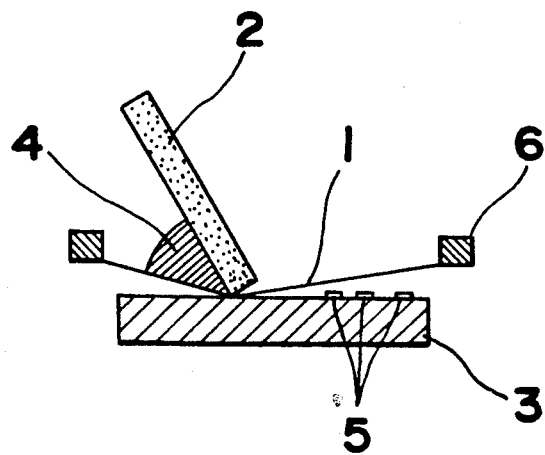
FIG. 5, 6, 7A and 7B are step sectional views showing the conventional circuit pattern forming method.
Figure 6:
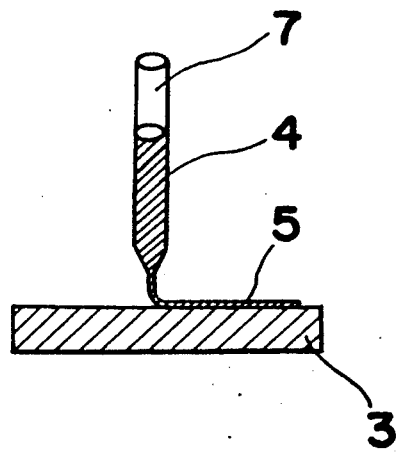
Figure 7A:
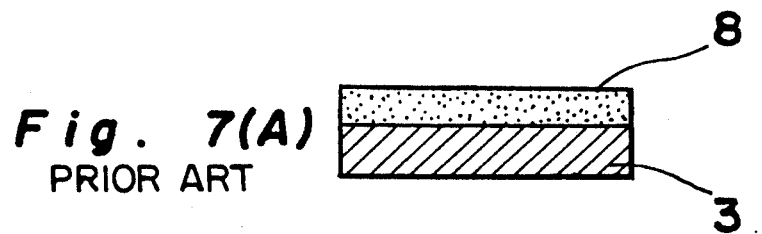
Figure 7B:
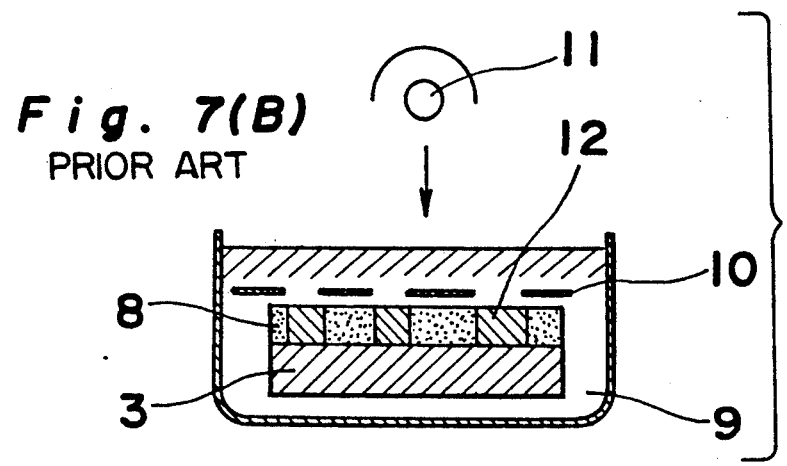
Figure 8A:
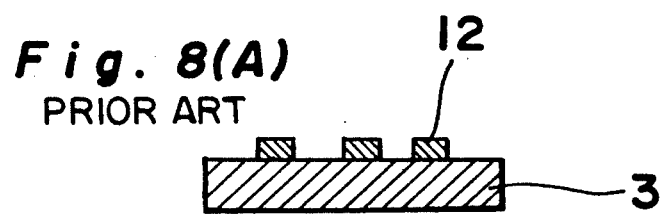
FIG. 8A and 8B are a step sectional view showing the conventional metallic copper deposition method.
Figure 8B:
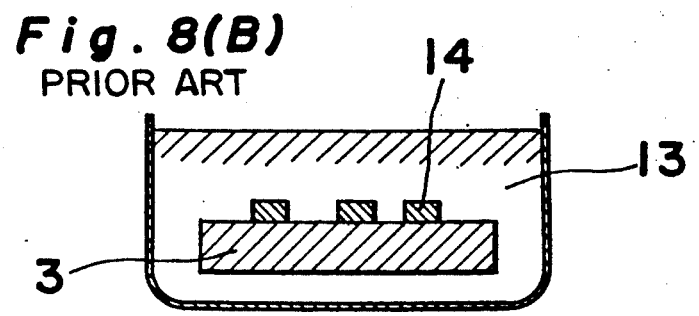

FIG. 3 (A), (B) are the sectional views showing a metallic copper deposition method in a third embodiment of the present invention. Also, the present embodiment was all carried out in a dark room.

First, gelatin powder, 30 g, is added to water, 300 ml. It is heated at 50° C. and is melted completely. Thereafter, hydroquinone, 1 g, citric acid, 0.6 g, and copper sulfate, 1 g, are added to it to obtain metallic deposition paste 19. Thereafter, the metal deposition paste 19 is applied on the metal 21 provided on the substrate 3 with the use of a nozzle so as to be retained for five minutes as shown in FIG. 3 (A). Thus, the copper 22 of the copper sulfate to contained in the metal deposition paste 19 is accumulated on the metal 21 as shown in FIG. 3 (B). Finally the metal deposition paste 19 is removed.

Although the gelatin was mixed in the metal deposition paste 19 in the present embodiment, other high molecular agents such as polyvinyl alcohol, cellulose acetate or the like may be used. Also, although the acidic hydroquinone was used as the reduction component, other reduction agents such as α-naphthol or the like may be used. Further, although copper sulfate was used as a material for supplying the metal, inorganic metallic salts shown by a general equation MnXm (n is 1 or more, m is 1 or more, M is Cn, Zn, Ni, Fe, Ag, Au or the like, X is Cl, Br, I, Cu, $SO_4$ or the like) or organometallic compound shown by (RCOO) mMn (n is 1 or more, m is 1 or more, R is alkyl group, acyl group or the like, M is Cu, Zn, Ni, Fe, Ag, Au or the like) may be used. Also, in the present embodiment, although a nozzle was used in applying the metal deposition paste, other applying methods such as printing or the like may be used.

Also, the desposition a skill of causing the medicine agent in paste state to be kept in a sheet may for the contacting operation. Embodiment 4

FIG. 4 (A) through (F) are sectional views showing a circuit pattern forming method in a fourth embodiment of the present invention. First, gelatin powder, 50 g, is added into water, 500 ml. It is heated at 50° C. 36N-sulfuric acid 0.01 ml is mixed with the completely melted gelatin powder form a light transmission paste. It is applied on the cuprous oxide 8 applied on the substrate 3 in a dark room as shown in FIG. 4 (A) is cooled, and hardened at 5° C. into light transmission membrane 15. This is irradiated only upon the portion for patterning, and deposition of the metallic copper, through a stainless mask 10 corresponding to the pattern which is adapted to transmitt light of the light source 11 using a tungsten lamp as shown in FIG. 4 (B). Thus, the light patterned by the mask 10 reaches the cuprous oxide through the light transmission membrane 15. At this time, since the cuprous oxide 8 is put under the acidic atmosphere by the light transmission membrane 15, the disproportioned reaction is caused, and the metallic copper pattern 12 is educed.

Thereafter, the light transmission membrane 15 is peeled off. Since the light is not irradiated because of an aqueous solution of sodium thiosulfate (sodium thiosulfate, 25 g, with respect to water, 100 ml), the disproportioned reaction is not caused. As a result, the residual cuprous oxide is removed. Thus, only the metallic copper pattern 12 exists on the substrate 3 as shown in FIG. 4 (C).

Then, in order to further improve the conductivity of the metallic copper pattern 12 obtained, the metal deposition paste is used. First, gelatin powder, 30 g, is added to water, 300 ml. It is heated at 50° C. and is melted completely. Thereafter, hydroquinone, 1 g, citric acid, 0.6 g, and copper sulfate, 1 g, are added to it to obtain the metallic deposition paste 19. It is applied on the metallic copper pattern 12 formed on the substrate 3 with the use of a nozzle so as to be retained for five minutes as shown in FIG. 4 (D). As a result, the copper of the copper sulfate is enduced on the metallic copper pattern 12 as shown in FIG. 4 (E). Then, these are cooled, and hardened at 5° C. The metal deposition paste 19 is removed, so that the metallic copper pattern 14 of high density may be formed on the substrate 3 shown in FIG. 4 (F).

Although the stainless-make mask 10 was used for patterning the light in the present embodiment, the light may be stopped into a beam state and be scanned.

Although the gelatin was mixed into the light transmission paste, other high molecular agents such as polyvinyl alcohol, cellulose acetate or the like may be used. Further, and acidic reagent such as hydrochloric acid, acetic acid, p-toluene sulfonic acid or the like may be used instead of the sulfuric acid. Further, the light transmission sheet of the third embodiment may be used without the use of the light transmission paste.

Although the gelatin was mixed into the metal deposition paste, other high molecular agents such as cellulose acetate or the like may be used. Also, although acidic hydroquinone was used as the reduction component, other reduction agents such as α-naphthol or the like may be used. Further, although the copper sulfate was used as a metal containing component to be used for metal deposition, metallic salts shown by a general formula CuX or $CuX_2$ (X is Cl, Br, I, CN, $SO_4$ or the like) or organic acid metallic salt shown by $(RCOO)_2Cu$ or RCOOCu (R is alkyl group, acyl group or the like) may be used. Also, in the present embodiment, although a nozzle was used in applying the metal deposition paste, other applying methods such as printing or the like may be used.

Also, the deposition paste a skill of causing the medicine in paste may be kept in sheet state for the contacting operation.

As is clear from the foregoing description, according to the arrangement of the present invention, the present invention can educe metallic copper in the desired portion by applying or the contacting light transmission paste on the cuprous oxide and applying light upon the desired portion.

Also, the light is applied through a mask corresponding to the pattern to be obtained, so that the desired circuit pattern may be easily obtained.

Further, metallic copper of high density may be educed by contacting or the applying metal deposition paste upon the metal of the substrate.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A circuit pattern forming method comprising the steps of
    applying a light transmission paste upon cuprous oxide formed on a substrate, wherein the light transmission paste contains an acidic material selected from the group consisting of hydrochloric acid, nitric acid, sulfuric acid and p-toluene sulfonic acid and is transparent to light of a wavelength of 280 nm through 640 nm,
    thereafter irradiating light of a wavelength of 280 nm through 640 nm onto the cuprous oxide through a mask having an opening portion corresponding to a pattern to be formed so as to educe metallic copper on the irradiated portion,
    then removing the light transmission paste and the mask, and
    forming the desired circuit pattern on the substrate.

2. A method as defined in claim 2, further comprising the steps of applying a metal deposition paste which comprises a copper salt and a reducing agent for reducing the copper salt onto the metallic copper on the substrate, and reducing the copper salt to deposit further copper on the metallic copper.

3. A circuit pattern forming method comprising the steps of
    providing a light transmission sheet which comprises a light transmission paste applied upon a support member which is transparent to light of a wavelength of 280 nm through 640 nm, wherein the light transmission paste contains an acidic material selected from the group consisting of hydrochloric acid, nitric acid, sulfuric acid and p-toluene sulfonic acid and is transparent to light of a wavelength of 280 nm through 640 nm,
    causing the light transmission sheet to contact cuprous oxide formed on a substrate,
    irradiating light of a wavelength of 280 nm through 640 nm onto the cuprous oxide from the transparent support side through a mask having an opening portion corresponding to a pattern to be formed so as to educe metallic copper on the irradiated portion,
    then removing the light transmission sheet and the mask, and
    forming the desired circuit pattern on the substrate.

4. A method as defined in claim 3, further comprising the steps of applying a metal deposition paste which comprises a copper salt and a reducing agent for reducing the copper salt onto the metallic copper on the substrate, and reducing the copper salt to deposit further copper on the metallic copper.

* * * * *